United States Patent [19]
Matsunaga

[11] Patent Number: 6,166,897
[45] Date of Patent: Dec. 26, 2000

[54] STATIC CHUCK APPARATUS AND ITS MANUFACTURE

[75] Inventor: Tadao Matsunaga, Shimizu, Japan

[73] Assignee: Tomoegawa Paper Co., Ltd., Tokyo, Japan

[21] Appl. No.: 09/010,934

[22] Filed: Jan. 22, 1998

[30]       Foreign Application Priority Data

Jan. 22, 1997  [JP]  Japan ..................................... 9-023192
Jan. 22, 1997  [JP]  Japan ..................................... 9-023193

[51] Int. Cl.$^7$ ................................................... H02N 13/00
[52] U.S. Cl. .......................................................... 361/234
[58] Field of Search ................... 361/233–235; 279/128

[56]                References Cited

U.S. PATENT DOCUMENTS

| | | | |
|---|---|---|---|
| 4,645,218 | 2/1987 | Ooshio et al. | 361/234 |
| 4,771,730 | 9/1988 | Tezuka | 361/234 |
| 5,155,652 | 10/1992 | Logan et al. | 361/234 |
| 5,384,682 | 1/1995 | Watanabe et al. | 361/234 |
| 5,452,177 | 9/1995 | Frutiger | 361/234 |
| 5,522,131 | 6/1996 | Steger | 361/234 |
| 5,631,803 | 5/1997 | Cameron et al. | 361/234 |
| 5,745,331 | 4/1998 | Shamouilian et al. | 361/234 |
| 5,822,172 | 10/1998 | White | 361/234 |
| 5,851,641 | 12/1998 | Matsunaga et al. | 361/234 |
| 5,978,202 | 11/1999 | Wadensweiler et al. | 361/234 |

FOREIGN PATENT DOCUMENTS 60216244   8/1994   Japan .

*Primary Examiner*—Michael J. Sherry
*Attorney, Agent, or Firm*—Oblon, Spivak, McClelland, Maier & Neustadt, P.C.

[57]                ABSTRACT

The static chuck apparatus includes a metal substrate, a first adhesive layer provided on the metal substrate, a ceramic insulating plate provided on the first adhesive layer, a second adhesive layer provided on the ceramic insulating plate, an insulating film provided on the second adhesive layer, and an electrode provided between the second adhesive layer and the insulating film.

13 Claims, 4 Drawing Sheets

PRIOR ART FIG.6
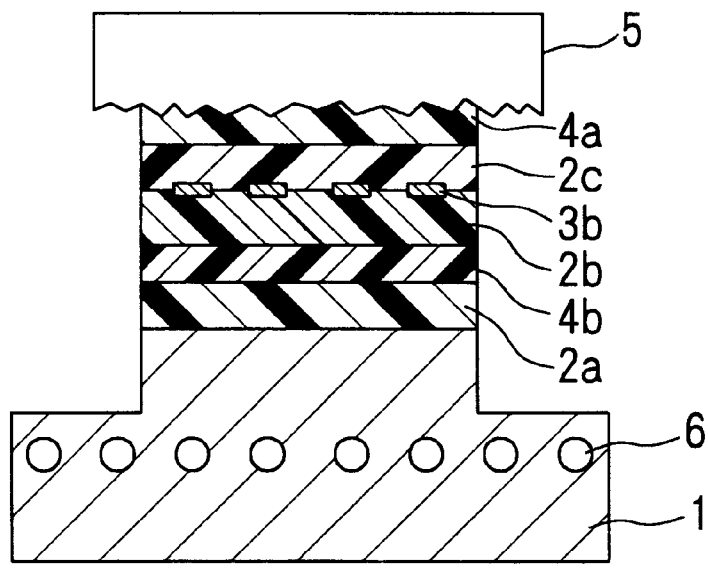
PRIOR ART FIG.7
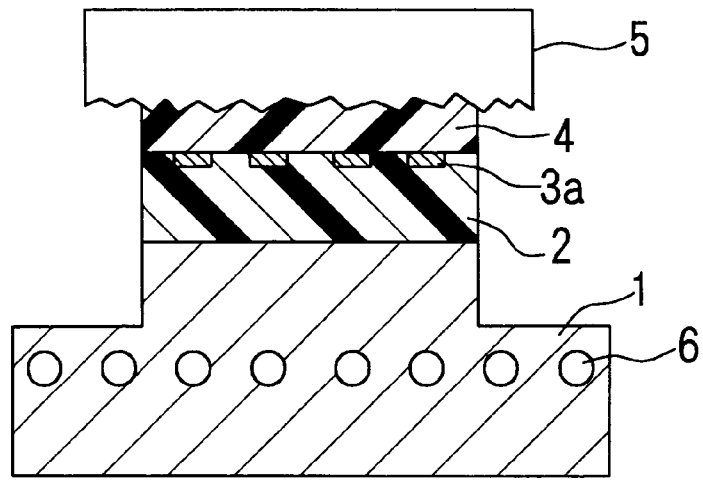

STATIC CHUCK APPARATUS AND ITS MANUFACTURE

BACKGROUND OF THE INVENTION

1. Field of the Invention

The present invention relates to a static chuck apparatus for attracting and securing a conductive material, such as a wafer, by the force of static electricity, a method for manufacturing the same, and an adhesive and an insulating film used for the manufacture thereof.

This application is based on Japanese Patent Applications Nos. Hei 9-23192 and Hei 9-23193, the contents of which are incorporated herein by reference.

2. Background Art

In the process of processing semiconductor wafers, a chuck apparatus is used for securing a semiconductor wafer at a prescribed position in a processing machine. As the chuck apparatus, there are mechanical apparatuses, vacuum type apparatuses, and static type apparatuses. The static type apparatuses have the advantage that they can attract uneven wafers, are easy to manipulate, and can be used in a vacuum.

During the processing of semiconductor wafers, since heat energy is generated on the semiconductor wafer, the semiconductor wafer locally expands and deforms unless the heat energy is dissipated adequately. Therefore, it is important that the heat generated during the processing be permitted to escape through the chuck apparatus to make the temperature distribution on the semiconductor wafer uniform.

An example of a conventional static chuck apparatuses is disclosed in Japanese Patent Application, Second Publication, No. Hei 5-87177. As is shown in FIG. 6, this apparatus has an adhesive layer 2a, an insulating film 4b, an adhesive layer 2b, an electrode layer 3b in the form of a metal sheet, an adhesive layer 2c, and an insulating film 4a layered successively on a metal substrate 1, and a wafer 5 is attracted on the insulating film 4a. In the metal substrate 1, temperature controlling spaces 6 for controlling temperature, for example, through constant-temperature water are formed.

However, in the static chuck apparatus shown in FIG. 6, since there are two insulating films, i.e., the insulating film 4a between the wafer 5 and the electrode layer 3b, and the insulating film 4b between the electrode layer 3b and the metal substrate 1, it is difficult for the heat of the semiconductor wafer 5 to escape to the metal substrate 1, and therefore there if inadequate temperature control of wafers.

Further, in the static chuck apparatus shown in FIG. 6, because there are portions where the metal sheet electrode layer 3b is present and portions where the metal sheet electrode layer 3b is absent, the wafer attraction surface became uneven due to the thickness of the electrode layer 3b, and gaps were formed between the wafer and the wafer-attraction surface at the resulting concavities, leading to a problem in that the heat conduction became locally worse. In particular, this phenomenon is conspicuous at the outer circumference of wafers.

On the other hand, FIG. 7 shows a static chuck apparatus disclosed in Japanese Patent Application, First Publication, No. Hei 8-148549. In this apparatus, a relatively thick insulating adhesive layer 2 is formed on a metal substrate 1, an electrode layer 3a, in the form of a deposited metal film or a plated film, is formed on the insulating adhesive layer 2, and an insulating film 4 is bonded onto the electrode layer 3a, and a semiconductor wafer 5 will be attracted to the insulating film 4.

In comparison to the apparatus shown in FIG. 6, in the apparatus shown in FIG. 7, the total thickness of the insulating film 4 the electrode layer 3a, and the adhesive layer 2 is small, and therefore the heat conduction is improved. However, to secure satisfactory insulating properties, it is necessary that the thickness of the adhesive layer 2 be at least 40 to 50 micrometers, and therefore the heat conductivity is still not satisfactory.

Furthermore, when the static chuck apparatuses shown in FIGS. 6 and 7 are used many times, the insulating films 4a and 4 having wafer-attraction surfaces are fatigued. All the parts above the metal substrates 1 must then be replaced. In that case, the number of required steps for replacing them is large, and particularly in the case wherein a thermosetting adhesive is used, it is necessary to remove the adhesive layers by washing, which have been made insoluble, and it is desired to simplify the steps.

SUMMARY OF THE INVENTION

Objects of the present invention are to improve the heat conductivity of static chuck apparatuses, to provide a static chuck apparatus wherein the replacement of an insulating film having an attracting surface is easy, and to provide a method for manufacturing the same.

To attain the above objects, a first static chuck apparatus according to the present invention comprises a metal substrate, a first adhesive layer provided on the metal substrate, a ceramic insulating plate provided on the first adhesive layer, a second adhesive layer provided on the ceramic insulating plate, an insulating film provided on the second adhesive layer, and an electrode provided between the second adhesive layer and the insulating film.

According to the first chuck apparatus, since the provision of the ceramic insulating plate between the metal substrate and the electrode can increase the insulating properties between the metal substrate and the electrode, it is not necessary to ensure the insulating properties by the second adhesive layer and the thickness of the second adhesive layer can correspondingly be decreased. Further, if the insulating film is damaged, it is sufficient that the second adhesive layer be removed from the ceramic insulating plate and that the insulating film and the second adhesive layer be replaced. At that time, since the second adhesive layer is thin, after the removal of the second adhesive layer, for example, the washing operation of the surface of the ceramic insulating plate can be simplified, and therefore the replacement operation of the insulating film is facilitated.

A second static chuck apparatus according to the present invention comprises a metal substrate, a first adhesive layer provided on the metal substrate, a ceramic insulating plate provided on the first adhesive layer, a second adhesive layer provided on the ceramic insulating plate, an insulating film provided on the second adhesive layer, and an electrode embedded in the upper surface of the ceramic insulating plate.

In this second static chuck apparatus also, since the provision of the ceramic insulating plate between the metal substrate and the electrode can increase the insulating properties between the metal substrate and the electrode, it is not necessary to ensure the insulation properties by the second adhesive layer, and the thickness of the second adhesive layer can correspondingly be decreased. Further, if the insulating film is damaged, it is sufficient that the second adhesive layer be removed from the ceramic insulating plate and that the insulating film and the second adhesive layer is replaced. At that time, since the second adhesive layer is thin, after the removal of the second adhesive layer, for example, the operation of washing the surface of the ceramic insulating plate can be simplified, and therefore the replacement operation of the insulating film is facilitated.

In either apparatus, at least one of the first adhesive layer and the second adhesive layer may contain one or more selected from among butadiene/acrylonitrile copolymers, olefin copolymers, and polyphenyl ether copolymers and a hindered phenol-type antioxidant (a phenol-type antioxidant having steric hindrance).

In this case, since the first adhesive layer and/or the second adhesive layer has a highly resilient resin component, the effects of an excessive stress is prevented from being applied to the ceramic insulating plate so that it is unlikely the ceramic insulating plate be cracked or warped when the static chuck apparatus is used. Further, the addition of a hindered phenol-type antioxidant allows radicals generated when the adhesive layer is exposed to a high temperature to be absorbed by the antioxidant to prevent the highly resilient resin component from being deteriorated, leading to the advantage that the effect of relaxing any stress lasts for a long period.

BRIEF DESCRIPTION OF THE DRAWINGS

FIG. 6 is a cross-sectional view of a conventional static chuck apparatus.

FIG. 7 is a cross-sectional view of a conventional static chuck apparatus.

DETAILED DESCRIPTION OF THE PREFERRED EMBODIMENTS

Hereinbelow, preferred embodiments of the present invention are described in detail.

Figure 1:
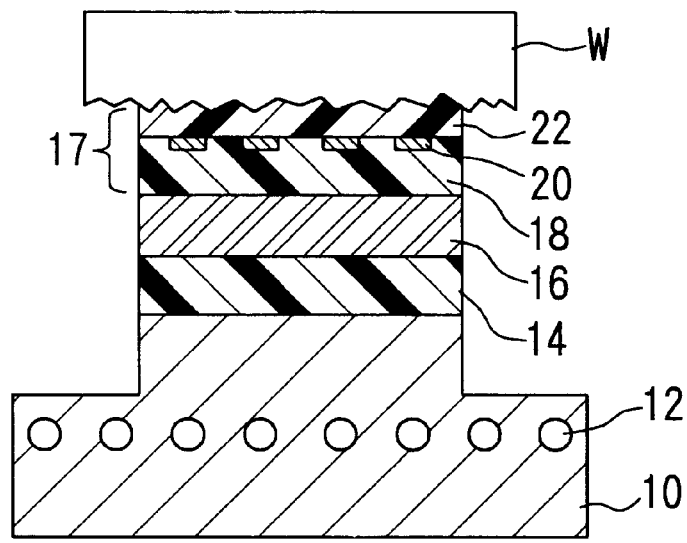
FIG. 1 is a cross-sectional view of an embodiment of the static chuck apparatus according to the present invention.

FIG. 1 shows an embodiment of the static chuck apparatus according to the present invention. The static chuck apparatus comprises a metal substrate 10 in the shape of a disk, a first adhesive layer 14 which has excellent insulating and stress relaxation properties, a ceramic insulating plate 16 in the shape of a disk, a second adhesive layer 18, and an insulating film 22 with an electrode layer 20 having a certain pattern between the second adhesive layer 18 and the insulating film 22. In the metal substrate 10, a heating medium path 12 is formed through which a heating medium for controlling the temperature of a wafer is passed.

The electrode layer 20 is made of a metal deposited film or a plated film that is deposited or plated on the undersurface of the insulating film 22. The electrode layer 20 is connected by a conducting means (not shown) through the second adhesive layer 18, the ceramic insulating plate 16, and the first adhesive layer 14 to a voltage generating apparatus, and when a voltage is applied to the electrode layer 20, polarized charges are generated on the attracting surface of the insulating film 22 to attract a semiconductor wafer W. However, the object to be attracted by the static chuck apparatus is not limited to a wafer but may be anything made of a conductive material or a semi-conductive material.

The insulating film 22, the electrode layer 20, and the second adhesive layer 18 constitute a laminated sheet 17 that can be removed from the ceramic insulating plate 16 when the insulating film 22 is worn.

Figure 3:
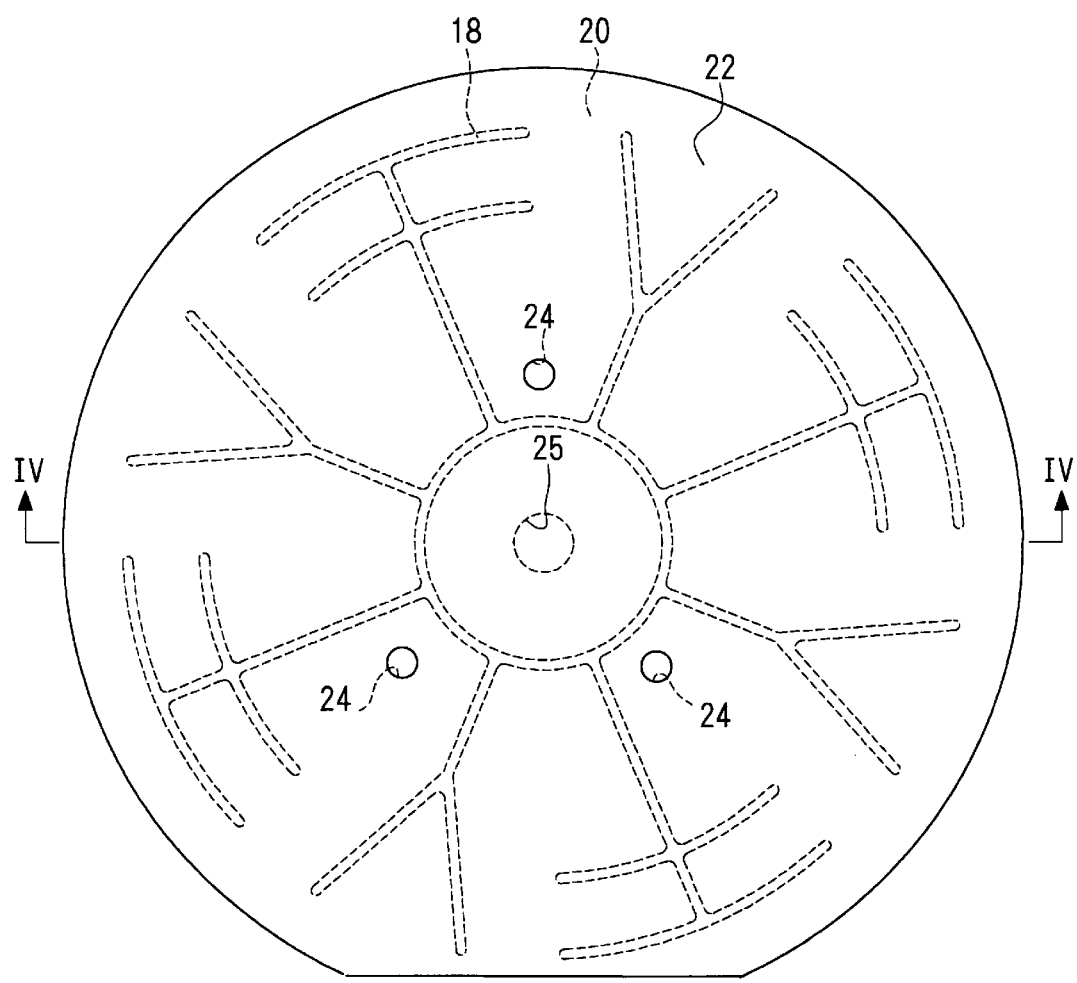
FIG. 3 is a plane view of another embodiment of the static chuck apparatus according to the present invention.
Figure 4:
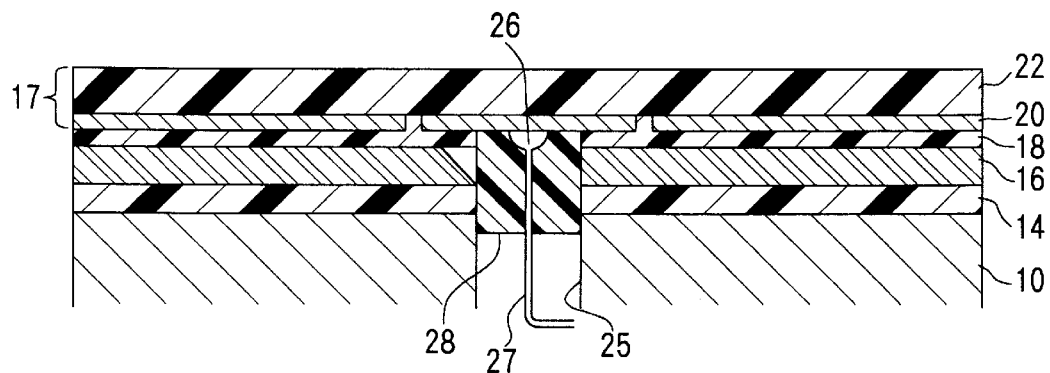
FIG. 4 is a cross-sectional view taken along the line IV—IV in FIG. 3.

FIGS. 3 and 4 shows this embodiment more specifically. As is shown in these figures, the static chuck apparatus is formed with three through-holes 24 extended vertically through the elements 10 to 22. A vertically movable rod (not shown) is arranged in each of the through-holes 24 and can be extended upward from the wafer attracting surface to elevate or lower the wafer W. A central hole 25 is formed to pass through the centers of the elements 10 to 18. An electricity feeding member 27, such as a lead wire, in the central hole 25 is connected through a connecting section 26 formed, for example, by soldering to the electrode layer 20, and the center hole 25 is sealed with an insulator 28 made, for example, of a resin. A voltage is applied to the electrode layer 20 from the outside through the electricity feeding member 27. The planar shape of the electrode layer 20 shown in FIG. 3 is only an example, and other different varied shapes are possible.

The material of the electrode layer 20 may be any metal that allows a thin film to be easily formed, for example, by depositing or plating, and allows a pattern to be easily formed, for example, by wet etching, such as copper, aluminum, tin, nickel, chromium, silver, palladium and alloys thereof.

The thickness of the electrode layer 20 is not limited and is preferably 300 angstroms to 10 micrometers. If the thickness of the electrode layer 20 is less than 300 angstroms, a uniform film is difficult to be formed and in the case of material high in reactivity such as aluminum, it is difficult to ensure stable conductivity because it is easily oxidized. On the other hand, if the thickness is over 10 micrometers, the cost of the formation of the film by deposition or plating becomes high. Taking the ease of manufacturing into consideration, the thickness of the electrode layer 20 should preferably be 500 angstroms to 5 micrometers.

Taking the electric properties, such as the electric constant $\epsilon$, the dielectric loss factor tan $\delta$, and the dielectric strength into account, the insulating film 22 is preferably an insulating film having a heat-resistance temperature of 150° C. or more. The insulating film having a heat resistance of 150° C. or more is, for example, made of a fluororesin (e.g., a fluoroethylene/propylene copolymer), a polyethersulphone, a polyetherketone, a cellulosetriacetate, a silicone rubber, or a polyimide, with preference given to a polyimide particularly. As the polyimide film, films commercially available, for example, under the trade name "KAPTON" (manufactured by Du Pont-Toray Co., Ltd.), "APICAL" (manufactured by KANEKA CORPORATION), and "Upilex" (manufactured by Ube Industries, Ltd.) can be mentioned.

The thickness of the insulating film 22 is not restricted but is preferably in the range of 20 to 75 micrometers. In view of the heat conductivity and the attraction force, although preferably the insulating film is thinner, taking the mechanical strength, the dielectric strength, and the durability (fatigue resistance) into account, particularly preferably the thickness is in the range of 40 to 60 micrometers.

The ceramic insulating plate 16 is required to be excellent in insulating properties and heat conductivity and to be resistant to solvents, and is one having smooth surfaces and specifically made preferably of alumina, aluminum nitride, silicon nitride, silicon carbide, zirconia, glass, or the like. The thickness of the ceramic insulating plate 16 is not restricted but is preferably in the range of 0.3 to 8 mm, more preferably 0.5 to 4 mm, and most preferably 0.5 to 2 mm with a view to securing a satisfactory durability while allowing the escape of the heat on the surface to be attracted.

The metal substrate 10, the first adhesive layer 14, the ceramic insulating plate 16, the second adhesive layer 18, and the insulating film 22 may be formed with a plurality of gas paths (not shown) open to the wafer attraction surface. By jetting out a small amount of an inert gas, particularly helium gas, through these gas paths, the cooling of the semiconductor wafer W can be facilitated.

The first adhesive layer 14 and the second adhesive layer 18 may be formed with either of thermosetting adhesives and thermoplastic adhesives. However, the adhesive to form the first adhesive layer 14 and the second adhesive layer 18 must be excellent in adhesion to the insulating film 22, the electrode layer 20, the ceramic insulating plate 16, and the metal substrate 10, and must have superior electrical properties and heat resistance. In particular, the first adhesive layer 14 is preferable to have a low Young's modulus and an excellent stress relaxation property. Examples of such adhesives are epoxy type adhesives, polyimide type adhesives, modified polyamide type adhesives, rubber type adhesives, polyamideimide type adhesives, and modified polyester type adhesives, which may be used singly or as a mixture.

A particularly preferable adhesive to form the first adhesive layer 14 and/or the second adhesive layer 18 is an adhesive containing one or more resilient-rich components selected from among butadiene/acrylonitrile copolymers, olefin copolymers, and polyphenyl ether copolymers and a hindered phenol-type antioxidant. The antioxidant absorbs radicals generated when the adhesive layer is exposed to a high temperature and functions to prevent the above resilient component from being deteriorated, whereby the deterioration of physical properties of the first adhesive layer 14 and the second adhesive layer 18, such as the loss of the resiliency, can be prevented.

As the component rich in resiliency, particularly butadiene/acrylonitrile copolymers are preferable because the resiliency thereof is appropriate and they are excellent in the action of alleviating the stress applied to the water W or the ceramic insulating plate 16.

As the hindered phenol-type antioxidant, a compound having three or more phenol groups each having two or more t-butyl groups attached thereto and possessing a molecular weight of 700 or more and more preferably 750 to 1500 is preferable. When these conditions are satisfied, the effect of alleviating stresses is hard to be deteriorated even when the static chuck apparatus is exposed to a high temperature.

A particularly preferable adhesive is one obtained by dissolving 10 to 90% by weight of a butadiene/acrylonitrile copolymer, 90 to 10% by weight of a compound having two or more maleimide groups, 0.3 to 20% by weight of the above hindered phenol-type antioxidant, and 5% by weight or less of a reaction accelerator, such as a peroxide, in a suitable organic solvent. By applying the adhesive and evaporating the organic solvent, a preferable first adhesive layer 14 and/or second adhesive layer 18 can be formed.

The above butadiene/acrylonitrile copolymer is preferably one or more in the form of a mixture selected from carboxyl-group-containing butadiene/acrylonitrile copolymers having a weight-average molecular weight of 1,000 to 200,000 and a carboxyl group equivalent of 30 to 10,000, acryl-group-containing butadiene/acrylonitrile copolymers having a weight-average molecular weight of 1,000 to 200,000 and an acryl group equivalent of 500 to 10,000, an epoxy-group-containing butadiene/acrylonitrile copolymers having a weight-average molecular weight of 1,000 to 200,000 and an epoxy group equivalent of 500 to 10,000, butadiene/acrylonitrile copolymers having a weight-average molecular weight of 1,000 to 200,000, piperazinylethylaminocarbonyl-group-containing butadiene/acrylonitrile copolymers having a weight-average molecular weight of 1,000 to 200,000 and an amino group equivalent of 500 to 10,000, and piperazinylethylaminocarbonyl-group-containing butadiene/acrylonitrile copolymers.

In order to minimize warping of the adhesive layers 14 and 18, it is preferable that the hindered phenol-type antioxidant has a weight reduction ratio when heated to 200° C. is less than 5%. The weight reduction ratio is measured by heating the antioxidant from room temperature to 200° C. at a speed of 10° C./min.

Specific examples of the hindered phenol-type antioxidant include 1,3,5-tris(3,5-di-t-butyl-4-hydroxybenzyl)-s-triazin-2,4,6-(1H, 3H, 5H)trione (molecular weight: 784, weight reduction ratio: 0%), 1,1,3-tris(2-methyl-4-hydroxy-5-t-butylphenyl)butane, tetrakis[methylene(3,5-di-t-butyl-4-hydroxyhydrocinnamate)]methane (molecular weight: 1178, weight reduction ratio: 0.2%), and 1,3,5-trimethyl-2,4,6-tris(3,5-di-t-butyl-4-hydroxybenzyl)benzene (molecular weight: 775, weight reduction ratio: 0%). In contrast, 2,6-di-t-butylphenol has a molecular weight of 206 and a weight reduction ratio of 86%.

A filler may be added to the adhesive layers. As the filler, for example, silica, quartz powder, alumina, calcium carbonate, magnesium oxide, diamond powder, mica, kaolinite, fluororesin powder, silicone powder, polyimide powder, and zircon powder can be used, which may be used singly or as a mixture of two or more. The content of the filler is 70% by weight or less and preferably 5 to 40% by weight based on the total solid content. If the content of the filler is over 70% by weight, the viscosity at the time of working is reduced and the adhesion and the strength after the hardening are reduced.

The thickness of the first adhesive layer 14 and the second adhesive layer 18 is not limited. However, the thickness of the first adhesive layer 14 is preferably 20–200 micrometers, more preferably, 60–120 micrometers, and most preferably, 80–100 micrometers. The thickness of the second adhesive layer 18 is preferably 5–50 micrometers, more preferably, 8–20 micrometers, and most preferably, 8–12 micrometers. That is, the thickness of the first adhesive layer 14 is preferably thicker than that of the second adhesive layer 18.

Furthermore, the warping ratio of the adhesive layer which can be measured by a method described later is preferably 0.03% or less.

In the static chuck apparatus of the present embodiment, since the second adhesive layer 18 is thin, it is easy to remove the adhesive completely from the ceramic insulating plate 16 by washing or the like when the laminated sheet 17 is peeled off and a new laminated sheet 17 is applied, whereby an advantage that allows the replacement operation of the laminated sheet 17 to be carried out easily is secured.

Next, the method for manufacturing the static chuck apparatus of the embodiment will be described.

First, the electrode layer 20 having a prescribed pattern (see FIG. 3) is formed on the whole of one surface of the insulating film 22. If the electrode layer 20 has a complicated pattern, although it can be made by forming a metal film having an electrode pattern directly on the insulating film 22, it can be made more easily by using a method wherein a photoresist is used. In this case, a metal film is formed on the whole of one surface of the insulating film 22 by vacuum deposition or plating with a metal and a photoresist layer is formed on the metal film. The photoresist layer may be formed by applying a liquid resist and drying it or may be formed by sticking a photoresist film (dry film) on the metal film by thermaocompression bonding.

Then, the photoresist layer is exposed and developed pattern-wise, the part of the photoresist where the metal film is to be dissolved is removed, the exposed part of the metal film is etched, washing is carried out, the resist is removed, and drying is carried out, thereby forming the electrode layer 20 having a prescribed shape. These procedures may be carried out by using known techniques of forming photoresist patterns.

After the formation of the electrode layer 20 on the insulating film 22, the whole surface of the insulating film 22 on which the electrode layer 20 has been formed is coated with a liquid adhesive for the formation of the second adhesive layer 18 in such a manner that the surface may become smooth and then the adhesive is dried to be half-hardened, thereby forming the second adhesive layer 18. If desired, a punching operation is carried out in conformity with the shape of the ceramic insulating plate 16 to obtain the laminated sheet 17.

Then, the ceramic insulating plate 16 is bonded to the metal substrate 10 through the first adhesive layer 14 and the second adhesive layer 18 of the laminated sheet 17 is bonded onto the ceramic insulating plate 16. In the case wherein the second adhesive layer 18 contains a thermosetting adhesive, heating is carried out as required to harden it. In this way, the static chuck apparatus of the present embodiment can be manufactured.

When the insulating film 22 is fatigued as a result of the processing of wafers, the laminated sheet 17 is separated from the ceramic insulating plate 16 and a new laminated sheet 17 is bonded. Since the second adhesive layer 18 is thin, the separation from the ceramic insulating plate 16 is easy and even if part of the second adhesive layer 18 remains on the ceramic insulating plate 16, the amount is small and therefore the removal is easy.

Figure 2:
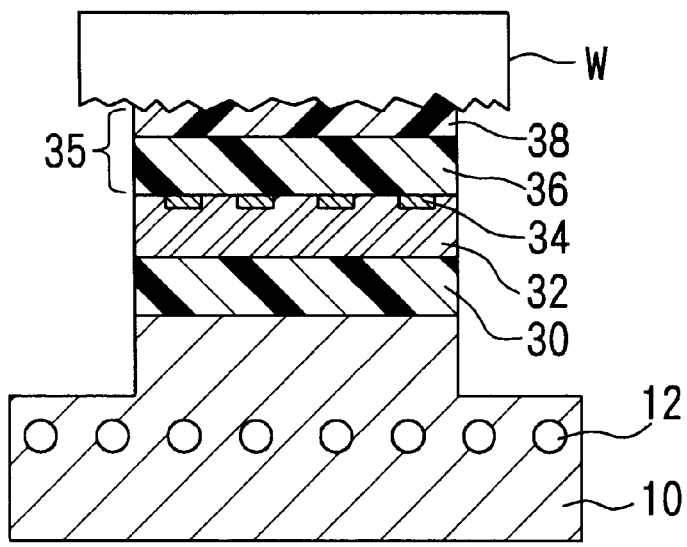
FIG. 2 is a cross-sectional view of another embodiment of the static chuck apparatus according to the present invention.

Next, another embodiment of the static chuck apparatus according to the present invention is described by reference to FIG. 2. This static chuck apparatus comprises a metal substrate 10 in the shape of a disk, a first adhesive layer 30 excellent in insulating and stress relaxation properties, a ceramic insulating plate 32 in the shape of a disk, a second adhesive layer 36, and an insulating film 38, and an electrode layer 34 having a certain pattern is embedded in the upper surface of the ceramic insulating plate 32. That is, the upper surface of the electrode layer 34 is coplanar with the upper surface of the ceramic insulating plate 32. Similarly to the first embodiment, a heating medium path 12 is formed in the metal substrate 10.

Figure 5:
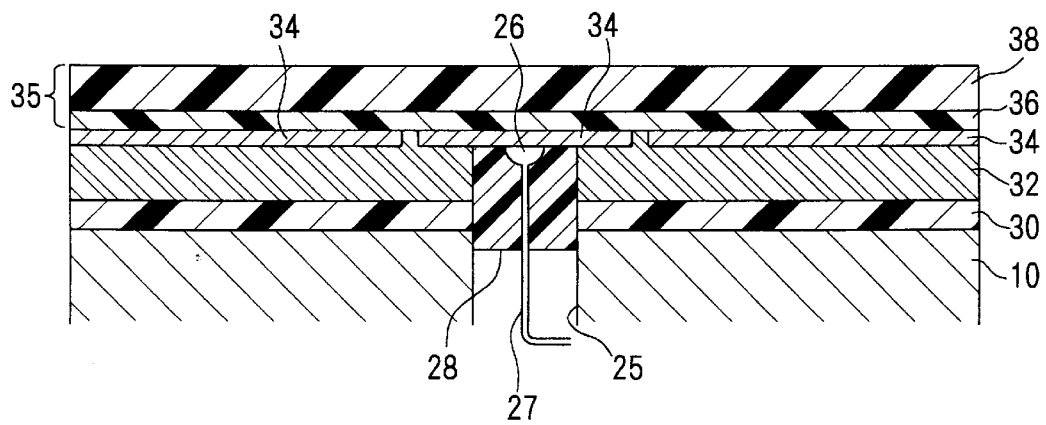
FIG. 5 is a cross-sectional view of another embodiment of the static chuck apparatus according to the present invention.

FIG. 5 shows the constitution of this embodiment more specifically, and similarly to the embodiment shown in FIG. 4, the apparatus of this embodiment is also formed with through-holes 24 for moving a wafer vertically and elements 25 to 28 for feeding electricity to the electrode layer 34. The planar shape of the electrode layer 34 may be the same as that of the electrode layer 20 shown in FIG. 3 and is not restricted. Similarly to the first embodiment, gas paths (not shown) may be formed.

The material of the electrode layer 34 may be the same as that of the above embodiment. The electrode layer 34 may be a metal foil formed by punching, a conductor formed by sintering a conductive paste, or a metal deposited film or a plated film that is deposited or plated on the ceramic insulating plate 32. Particularly, silver, platinum, palladium, molybdenum, magnesium, and tungsten and their alloys are preferable because they can be handled in the form of a paste or a powder and therefore are excellent in workability and printability. In particular, palladium alloy is preferable. In the case where the electrode layer 34 is relatively thick, a recessed part corresponding to the pattern of the electrode layer 34 is formed in the upper surface of the ceramic insulating plate 32, and the electrode layer 34 is formed in the recessed part. In the case where a recessed part is formed, if there is a difference in level between the ceramic insulating plate 32 and the electrode layer 34, the adhesion of the wafer W becomes poor and therefore preferably the upper surfaces of the ceramic insulating plate 32 and the electrode layer 34 are made smooth, for example, by polishing after the formation of the electrode layer 34.

The thickness of the electrode layer 34 is not restricted but in this embodiment the electrode layer 34 may be relatively thick and preferably is 0.05 to 2 mm and more preferably 0.05 to 1 mm. In the case where the electrode layer 34 is very thin, it is not necessary to form a recessed part on the surface of the ceramic insulating plate 32, the electrode layer 34 may be formed directly on the ceramic insulating plate 32.

The insulating film 38 and the second adhesive layer 36 constitute a laminated sheet 35 that will be replaced by separating it from the ceramic insulating plate 32 and the electrode layer 34 when the insulating film 38 is worn.

The material and the thickness of the insulating film 38 are similar to those of the insulating film 22 of the above embodiment and preferably the thickness is in the range of 20 to 75 micrometers and particularly preferably in the range of 40 to 60 micrometers.

The material of the ceramic insulating plate 32 is the same as that of the ceramic insulating plate 16 of the first embodiment. The thickness of the ceramic insulating plate 32 is not restricted but preferably is in the range of 0.5 to 8 mm, more preferably 0.5 to 4 mm, and most preferably 0.5 to 1 mm with a view to securing a satisfactory durability while allowing the escape of the heat of the surface to be attracted.

The metal substrate 10, the first adhesive layer 30, the ceramic insulating plate 32, the second adhesive layer 34, and the insulating film 38 are formed with a plurality of gas paths (not shown) open to the wafer attraction surface.

The adhesive for the formation of the first adhesive layer 30 and the second adhesive layer 36 may be the same as that of the first embodiment. The thickness of the first adhesive layer 30 and the second adhesive layer 36 is not restricted. However, the thickness of the first adhesive layer 30 is preferably 20–200 micrometers, more preferably, 50–150 micrometers, and most preferably, 80–120 micrometers. The thickness of the second adhesive layer 36 is preferably 5–100 micrometers, more preferably, 5–50 micrometers, and most preferably, 10–30 micrometers.

In the static chuck apparatus of the present invention, since the ceramic insulating plate 32 high in insulating properties is placed between the electrode layer 34 and the metal substrate 10, the insulating properties between the electrode layer 34 and the metal substrate 10 can be increased satisfactorily. Further, since the second adhesive layer 36 is thin, it is easy to remove the adhesive completely from the ceramic insulating plate 32 and the electrode layer 34 by washing or the like when the laminated sheet 35 is removed. Furthermore, the laminated sheet 35 does not include the electrode layer 34, the replacement operation of the laminated sheet 35 can be easily carried out.

Next, the method for manufacturing the static chuck apparatus of this embodiment will be described.

First, one surface of the ceramic insulating plate 32 is ground to form a recessed part having a constant depth and having a pattern corresponding to the shape of the electrode layer 34. Then, the electrode layer 34 is formed in the recessed part. The electrode layer 34 may be formed by bonding a metal plate previously formed by punching or the like to the recessed part, or may be formed by deposition or plating. However, in order to form the electrode layer 34 efficiently, for example, a conductive paste containing a metal fine powder of platinum, palladium, silver, or the like is applied to the ground part by screen printing and then hardening by heating is carried out followed, if required, by sintering at several hundreds ° C. to form the electrode layer 34. If necessary, the surface where the electrode layer 34 is formed is made smooth by polishing or the like. Alternatively, when the ceramic insulating plate 32 is manufactured, a ceramic insulating plate not sintered is formed with a recessed part having a prescribed pattern, a conductive paste is applied by printing or coating, and the resulting ceramic insulating plate is sintered.

Then, the undersurface of the ceramic insulating plate 32 is bonded through the first adhesive layer 30 to the metal substrate 10. The ceramic insulating plate 32 and the metal substrate 10 are desirably formed previously with the through-hole 25 in the direction of the thickness and after the electricity feeding member 27 is connected to the electrode layer 34, the through-hole 25 is sealed with the insulator 28.

Then, the second adhesive layer 36 in a half-hardened state of the laminated sheet 35 is bonded on the upper surfaces of the ceramic insulating plate 32 and the electrode layer 34 and they are heated to harden the second adhesive layer 36.

When the insulating film 38 is fatigued as a result of the processing of wafers, the laminated sheet 35 is separated from the ceramic insulating plate 32 and a new laminated sheet 35 is bonded. Since the second adhesive layer 36 is thin, the separation from the ceramic insulating plate 32 is easy and even if part of the second adhesive layer 36 remains on the ceramic insulating plate 32, the amount is small and therefore the removal is easy.

Further, in this embodiment, since the electrode layer 34 is not contained in the laminated sheet 35, the cost of the replacement of the laminated sheet 35 can be reduced.

EXAMPLES

Example 1

Aluminum was deposited on an insulating film made of a polyimide having a thickness of 50 micrometers (trade name: "Kapton" manufactured by Du Pont-Toray Co., Ltd.) to a thickness of 800 angstroms, a negative type photosensitive film (trade name: OZATEC-T538 manufactured by Hoechst Co.) was adhered, and they were passed through the steps of exposure-development-etching-washing-drying to form an electrode layer having a prescribed shape. The development was carried out by spraying a 1% aqueous sodium carbonate solution, the etching was carried out by spraying an aqueous hydrochloric acid solution of ferrous chloride and ferric chloride, and the washing was carried out by using deionized water.

Then, the electrode layer surface of the polyimide film was coated with an adhesive having the below-shown composition so that the thickness after the drying would be 30 micrometers and the adhesive was dried at 150° C. for 5 minutes to form a second adhesive layer, thereby producing a laminated sheet.

| | |
|---|---|
| acrylonitrile/butadiene rubber (trade name: Nippol 1001 manufactured by Nippon Zeon Co., Ltd.): | 100 parts by weight |
| epoxy resin (trade name: Epicoto YL-979 manufactured by Yuka Shell Epoxy Co., Ltd.): | 50 parts by weight |
| cresol type phenolic resin (trade name: CKM2400 manufactured by Showa Highpolymer Co., Ltd.): | 50 parts by weight |
| dicyandiamide (manufactured by Wako Pure Chemical Industries, Co., Ltd.): | 5 parts by weight |
| methyl ethyl ketone: | 500 parts by weight |

Then, the above adhesive was applied on the aluminum substrate so that the thickness after drying would be 30 micrometers, the coating was dried at 150° C. for 5 minutes to form a first adhesive layer, and an alumina ceramic insulating plate having a thickness of 3 mm (trade name: AL-13 manufactured by Toshiba Ceramics Co., Ltd.) was adhered thereto. At that time, a through-hole was formed in the aluminum substrate and the ceramic insulating plate and an electricity feeding member was installed in the through-hole so that a voltage would be applied between the electrode layer and the metal substrate.

Then, the insulating plate and the second adhesive layer of the laminated sheet was adhered together and they were subjected to step curing treatment at 80 to 150° C. for 5 hours to produce a static chuck apparatus having a static chuck surface having a diameter of 8 inches according to the present invention.

Example 2

Example 1 was repeated, except that instead of the alumina ceramic insulating plate, a silicon nitride ceramic insulating plate having a thickness of 2 mm (trade name: TSN-03 manufactured by Toshiba Ceramics Co., Ltd.) was used and as the electrode layer a plated copper film having 500 angstroms was used, thereby producing a static chuck apparatus having a diameter of 8 inches according to the present invention.

Example 3

One surface of an alumina ceramic insulating plate having a thickness of 2 mm (trade name: AL-16 manufactured by Toshiba Ceramics Co., Ltd.) was ground to form a recessed part having a depth of 0.1 mm based on a prescribed pattern. Then, a silver paste having the below-shown composition was prepared and applied to the ground part of the insulating plate, and after heating to harden the electrode layer, the surfaces of the ceramic insulating plate and the electrode layer were polished to make them smooth.

| | |
|---|---|
| silver powder (trade name: Silvest TCG-7 manufactured by Tokuriki Kagaku Kenkyujyo): | 79 parts by weight |
| epoxy resin (trade name: Epicoto 1001 manufactured by Yuka Shell Epoxy Co., Ltd.): | 6 parts by weight |
| butadiene/acrylonitrile copolymer (trade name: Hycar ATBN 1300X16 manufactured by Ube Industries, Ltd.): | 2 parts by weight |
| dicyandiamide (manufactured by Wako Pure Chemical Industries, Ltd.) | 1 part by weight |
| ethyl cellosolve: | 12 parts by weight |

Then, the non-electrode surface of the ceramic insulating plate was coated with an adhesive having the below-shown composition so that the thickness after drying would be 20 micrometers and the adhesive was dried at 150° C. for 5 minutes, thereby bonding the ceramic insulating plate to the metal substrate. A through-hole was formed in the metal substrate and the ceramic insulating plate in the direction of the thickness and an electricity feeding member was passed through the through-hole so that a voltage would be applied between the electrode layer and the metal substrate.

| | |
|---|---|
| acrylonitrile/butadiene rubber (trade name: 1001 manufactured by Nippon Zeon Co., Ltd.): | 100 parts by weight |
| epoxy resin (trade name: Epicoto YL-979 manufactured by Yuka Shell Epoxy Co., Ltd.): | 50 parts by weight |
| cresol type phenolic resin (trade name: CKM2400 manufactured by Showa Highpolymer Co., Ltd.): | 50 parts by weight |
| dicyandiamide (manufactured by Wako Pure Chemical Industries, Ltd.): | 5 parts by weight |
| methyl ethyl ketone: | 500 parts by weight |

Then, one surface of an insulating polyimide film having a thickness of 50 micrometers (trade name: Kapton manufactured by Du Pont-Toray Co., Ltd.) was coated with the above adhesive so that the thickness after the drying would be 20 micrometers, and after the adhesive was dried at 150° C. for 5 minutes to form a second adhesive layer, the insulating polyimide film and the metal substrate were put together and were bonded by step-curing treatment at 80 to 150° C. for 5 hours, thereby producing a static chuck apparatus having a static chuck surface with a diameter of 8 inches according to the present invention.

Example 4

Example 3 was repeated, except that instead of the alumina ceramic insulating plate used in Example 3, a silicon nitride ceramic insulating plate having a thickness of 3 mm (trade name: TSN-03 manufactured by Toshiba Ceramics Co., Ltd.) was used, the depth formed by grinding was 0.3 mm, and for the electrode layer a silver/palladium alloy paste was used and was sintered, thereby manufacturing a static chuck apparatus.

Example 5

Example 3 was repeated, except that instead of the alumina ceramic insulating plate, an aluminum nitride ceramic insulating plate having a thickness of 4 mm (trade name: TAN-01 manufactured by Toshiba Ceramics Co., Ltd.) was used, the depth formed by grinding was 0.4 mm, and for the electrode layer a platinum/palladium alloy was used and was sintered, thereby manufacturing a static chuck apparatus.

Example 6

Example 3 was repeated, except that instead of the alumina ceramic insulating plate, an unsintered silicon nitride ceramic insulating plate having a thickness of 3 mm (trade name: TSC-01 manufactured by Toshiba Ceramics Co., Ltd.) was used, a recessed part having a depth of 0.08 mm that would form a prescribed electrode pattern was formed in the unsintered ceramic insulating plate, in the recessed part an electrode layer was formed by using a silver/palladium alloy paste and the electrode layer was sintered to form a ceramic insulating plate having a thickness of 2 mm, thereby manufacturing a static chuck apparatus.

Example 7

Example 3 was repeated, except that instead of the alumina ceramic insulating plate, an alumina ceramic having a thickness of 1.5 mm (trade name: AL-13 manufactured by Toshiba Ceramics Co., Ltd.) was used, which was sintered with a recessed part formed that had a depth of 0.06 mm in a prescribed electrode pattern and was provided with an electrode layer of a silver/palladium alloy, thereby manufacturing a static chuck apparatus of the present invention.

Comparative Example 1

The insulating polyimide film having a thickness of 50 micrometers used in Example 1 was coated with the adhesive used in Example 1 so that the thickness of the adhesive layer after drying would be 10 micrometers, the adhesive layer was dried at 150° C. for 5 minutes, and a copper foil having a thickness of 23 micrometers was adhered thereto, followed by step curing treatment 80 to 150° C. A negative type photosensitive film (trade name: OZATEC-T538 manufactured by Hoechst Co., Ltd.) was used for the copper foil surface of the polyimide film and exposure, development, etching, washing, and drying were carried out to form an electrode having a prescribed shape.

On the other hand, one surface of the above polyimide film was coated with the above adhesive coating so that the adhesive layer after drying would be 10 micrometers, and the adhesive layer was dried at 150° C. for 5 minutes to form an adhesive layer. This adhesive layer and the electrode surface of the polyimide film with the electrode formed were adhered. Then, one surface of the thus laminated polyimide film was coated with the adhesive coating so that the thickness after drying would be 20 micrometers, the adhesive coating was dried at 150° C. for 5 minutes, then, it was adhered to the metal substrate used in Example 1, and step curing treatment at 80 to 150° C. was carried out, thereby producing a static chuck apparatus with a static chuck surface 8 inches in diameter having a conventional structure shown in FIG. 6.

Comparative Example 2

An electrode layer was formed in the same way as in Comparative Example 1, except that one surface of the insulating polyimide film was formed with an aluminum deposited film having a thickness of 800 angstroms. The electrode layer surface of the polyimide film was coated with the adhesive coating used in Example 1 so that the thickness after drying would be 20 micrometers, and the adhesive coating was dried at 150° C. for 5 min. Further, the adhesive layer surface was coated again to form an adhesive layer having a thickness of 40 micrometers.

Then, the metal substrate used in Example 1 and the adhesive layer surface of the polyimide film having the electrode layer formed were adhered and were subjected to step curing treatment for 80 to 150° C., thereby producing a static chuck apparatus with a static chuck surface 8 inches in diameter having a conventional structure shown in FIG. 7.

Evaluation Experiment 1

Using the static chuck apparatuses obtained in Examples and Comparative Examples above, the surface temperatures of semiconductor wafers were measured. The results are shown in Table 1.

Method of Measurement

A temperature measuring plate was adhered to a semiconductor wafer, discharging was carried out for 1 minutes under the following etching conditions, and the temperatures at the central part, the circumferential edge part, and the middle part between the center and the circumference of the wafer were measured. The voltage applied to the electrode at the time of the attraction was 2.0 kV.

Etching Conditions

High-frequency output: 1,400 (W); Chamber vacuum: 40 (mTorr); Gas filled in the chamber: $CHF_3/CO=45/155$ (sccm); He gas to be flown into the clearance formed when the wafer and the static chuck surface were brought in contact with each other: 10 (Torr); Temperature in the chamber (upper part/side/bottom): 60/60/20 (° C.)

TABLE 1

|  | Central part (° C.) | Middle part (° C.) | Edge part (° C.) |
|---|---|---|---|
| Example 1 | 71–76 | 71–76 | 87–93 |
| Example 2 | 71–76 | 71–76 | 87–93 |
| Example 3 | 71–76 | 71–76 | 86–93 |
| Example 4 | 71–76 | 71–76 | 87–93 |
| Example 5 | 71–76 | 71–76 | 86–92 |
| Example 6 | 71–76 | 71–76 | 86–92 |
| Example 7 | 71–76 | 71–76 | 86–92 |
| Comparative Example 1 | 71–76 | 71–77 | 95–103 |
| Comparative Example 2 | 71–76 | 71–76 | 90–96 |

As is apparent from the results shown in Table 1, it has been found that, in the static chuck apparatuses of Examples 1 to 7, the temperatures at the edge parts of the semiconductor wafers are lower than those of Comparative Examples 1 and 2 and the heat dissipation effect is large. In the static chuck apparatuses of Examples 1 to 7, since the insulation is secured by the ceramic insulating plates, the first and second adhesive layers can be made thinner than those of Comparative Examples 1 and 2 and therefore the heat dissipation effect is large.

Example 8

First Adhesive 80 parts by weight of an acrylonitrile/butadiene copolymer having a piperazinylethylaminocarbonyl group at the opposite ends ("Hycar ATBN" manufactured by Ube Industries, Ltd.) (m=83.5; n=16.5; weight-average molecular weight=3,600; acrylonitrile content=16.5%) was dissolved in 80 parts by weight of a toluene/methyl ethyl ketone mixed liquid (1:1), then 20 parts by weight of a maleimide compound denoted by the below-shown formula (I), 0.1 part by weight of Lauroyl peroxide (manufactured by NOF Corporation), and 1 part by weight of tetrakis[methylene(3,5-di-t-butyl-4-hydroxy(dihydrocinnamate)]methane ("Adecastab AO-60" manufactured by Asahi Denka Kogyo K.K.) were mixed with the resulting solution, and the mixture was dissolved in tetrahydrofuran, thereby preparing a liquid adhesive having a solid content of 40% by weight.

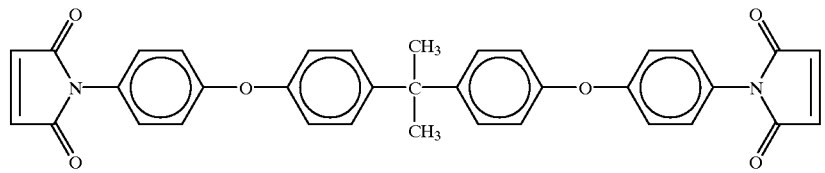

Example 9

Second Adhesive 50 parts by weight of an acrylonitrile/butadiene copolymer having a piperazinylethylaminocarbonyl group at the opposite ends ("Hycar ATBN" manufactured by Ube Industries, Ltd.) (m=83.5; n=16.5; weight-average molecular weight=3,600; acrylonitrile content=16.5%) was mixed with 30 parts by weight of an acrylonitrile/butadiene copolymer having a piperazinylethylaminocarbonyl group at the opposite ends (m=80; n=20; weight-average molecular weight=10,000; acrylonitrile content=20%), the mixture was dissolved in 80 parts by weight of a toluene/methyl ethyl ketone mixed liquid (1:1), then 20 parts by weight of a maleimide compound denoted by the above formula (I), 0.1 part by weight of Lauroyl peroxide (manufactured by NOF Corporation), and 1 part by weight of tetrakis[methylene(3,5-di-t-butyl-4-hydroxy(dihydrocinnamate)]methane ("Adecastab AO-60" manufactured by Asahi Denka Kogyo K.K.) were mixed with the resulting solution, and the mixture was dissolved in tetrahydrofuran, thereby preparing a liquid adhesive having a solid content of 40% by weight.

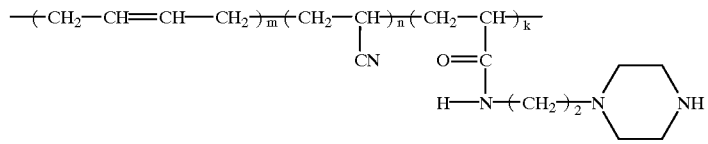

Example 10

Third Adhesive

Example 8 was repeated, except that instead of the tetrakis[methylene(3,5-di-t-butyl-4-hydroxy (dihydrocinnamate)]methane, 1,3,5-tris(3,5-di-t-butyl-4-hydroxybenzyl)-s-triazin-2,4,6-(1H, 3H, 5H)trione ("Adecastab AO-20" manufactured by Asahi Denka Kogyo K.K.) was used, thereby preparing a liquid adhesive.

Example 11
Fourth Adhesive

Example 8 was repeated, except that instead of the tetrakis[methylene(3,5-di-t-butyl-4-hydroxy(dihydrocinnamate)]methane, 1,3,5-trimethyl-2,4,6-tris(3,5-di-t-butyl-4-hydroxybenzyl)benzene ("Adecastab AO-330" manufactured by Asahi Denka Kogyo K.K.) was used, thereby preparing a liquid adhesive.

Example 12
Fifth Adhesive

Example 8 was repeated, except that the added amount of the tetrakis[methylene(3,5-di-t-butyl-4-hydroxy(dihydrocinnamate)]methane was changed from 1 part by weight to 10 parts by weight, thereby preparing a liquid adhesive.

Example 13
Sixth Adhesive

Example 8 was repeated, except that the maleimide compound was changed to a maleimide compound denoted by the following formula (III), thereby preparing a liquid adhesive. In the formula, "p" is a number selected from 0–7.

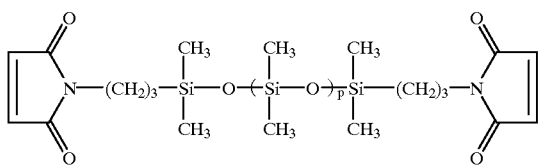

Example 14
Seventh Adhesive 40 parts by weight of an acrylonitrile/butadiene copolymer having a piperazinylethylaminocarbonyl group at the opposite ends ("Hycar ATBN" manufactured by Ube Industries, Ltd.) (m=83.5; n=16.5; weight-average molecular weight=3,600; acrylonitrile content=16.5%) and 40 parts by weight of an acrylonitrile/butadiene copolymer having a vinyl group at the opposite ends ("Hycar VTBN" manufactured by Ube Industries, Ltd.) (m=83.5; n=16.5; weight-average molecular weight=3,600; acrylonitrile content= 16.5%) were dissolved in 80 parts by weight of a toluene/methyl ethyl ketone mixed liquid (1:1), the resulting solution was mixed with 20 parts by weight of a maleimide compound represented by the above formula (I), 0.1 part by weight of α-α'-bis(t-butylperoxy-m-isopropyl)benzene (manufactured by NOF Corporation), and 1 part by weight of tetrakis[methylene(3,5-di-t-butyl-4-hydroxy(dihydrocinnamate)]methane ("Adecastab AO-60" manufactured by Asahi Denka Kogyo K.K.), and the mixture was dissolved in tetrahydrofuran, thereby preparing a liquid adhesive having a solid content of 40% by weight.

Example 15
Eighth Adhesive

Example 14 was repeated, except that instead of the acrylonitrile/butadiene copolymer having vinyl groups ("Hycar VTBN" manufactured by Ube Industries, Ltd.), an acrylonitrile/butadiene copolymer having a carbonyl group at the opposite ends "Hycar CTBN" manufactured by Ube Industries, Ltd.) (m=2.7; n=1; weight-average molecular weight=3,500; acrylonitrile content=16.5%) was used in an amount of 40 parts by weight, thereby preparing a liquid adhesive.

Example 16
Ninth Adhesive 70 parts by weight of an acrylonitrile/butadiene copolymer having a piperazinylethylaminocarbonyl group at the opposite ends ("Hycar ATBN" manufactured by Ube Industries, Ltd.) (m=83.5; n=16.5; weight-average molecular weight=3,600; acrylonitrile content=16.5%) and 10 parts by weight of bisphenol A ("Epicoto 82" manufactured by Yuka Shell Epoxy Co., Ltd.) were dissolved in 80 parts by weight of a toluene/methyl ethyl ketone mixed liquid (1:1), then 20 parts by weight of a maleimide compound denoted by the above formula (I), 0.1 of part by weight of α-α'bis(t-butylperoxy-m-isopropyl)benzene (manufactured by Nippon Oil and Fats Co., Ltd.), 0.3 part by weight of dicyandiamide, and 1 part by weight of tetrakis[methylene(3,5-di-t-butyl-4-hydroxy(dihydrocinnamate)]methane ("Adecastab AO-60" manufactured by Asahi Denka Kogyo K.K.) were mixed with the resulting solution, and the mixture was dissolved in tetrahydrofuran, thereby preparing a liquid adhesive having a solid content of 40% by weight.

Example 17
Tenth Adhesive 100 parts by weight of a butadiene/acrylonitrile copolymer (weight-average molecular weight: 250,000; acrylonitrile content: 27%), 20 parts by weight of p-t-butylphenyl type resol phenol resin ("CKM-1282" manufactured by Showa Highpolymer Co., Ltd.), 20 parts by weight of a novolak epoxy resin ("EOCN-1020" manufactured by NOF Corporation), 25 parts by weigh of a maleimide compound denoted by the above formula (I), 5 parts by weight of 1,3-bis(3-aminopropyl)-1,1,3,3-tetramethyldisiloxane, 0.1 part by weight of α-α'bis(t-butylperoxy-m-isopropyl)benzene (manufactured by Nippon Oil and Fats Co., Ltd.), and 1 part by weight of tetrakis[methylene(3,5-di-t-butyl-4-hydroxy(dihydrocinnamate)]methane ("Adecastab AO-60" manufactured by Asahi Denka Kogyo K.K.) were mixed, and the mixture was dissolved in tetrahydrofuran, thereby preparing a liquid adhesive having a solid content of 30% by weight.

Example 18
Eleventh Adhesive 60 parts by weight of an acrylonitrile/butadiene copolymer having a piperazinylethylaminocarbonyl group at the opposite ends ("Hycar ATBN" manufactured by Ube Industries, Ltd.) (m=83.5; n=16.5; weight-average molecular weight=3,600; acrylonitrile content=16.5%) was dissolved in a toluene/methyl ethyl ketone mixed liquid (1:1), the resulting solution was mixed with 40 parts by weight of a maleimide compound represented by the above formula (I), 0.1 part by weight of Lauroyl peroxide (manufactured by Nippon Oil and Fats Co., Ltd.), 1 part by weight of tetrakis[methylene(3,5-di-t-butyl-4-hydroxy(dihydrocinnamate)]methane ("Adecastab AO-60" manufactured by Asahi Denka Kogyo K.K.), and 25 parts by weight of spherical alumina filler having an average particle diameter of 5 micrometers, and the mixture was dissolved in tetrahydrofuran, thereby preparing a liquid adhesive having a solid content of 40% by weight.

Comparative Example 3
First Adhesive for Comparison

Example 8 was repeated, except that the tetrakis [methylene(3,5-di-t-butyl-4-hydroxy(dihydrocinnamate)] methane was not used, thereby preparing a liquid adhesive having a solid content of 40% by weight.

Comparative Example 4
Second Adhesive for Comparison

Example 8 was repeated, except that instead of the tetrakis[methylene(3,5-di-t-butyl-4-hydroxy (dihydrocinnamate)]methane, di-t-butylphenol was used, thereby preparing a liquid adhesive having a solid content of 40% by weight.

Comparative Example 5
Third Adhesive for Comparison 100 parts by weight of an epoxy acrylate ("R-551" manufactured by Nippon Kayaku Co., Ltd.) and 1 part by weigh of benzoyl peroxide were dissolved in a toluene/methyl ethyl ketone mixed liquid (1:1), thereby preparing a liquid adhesive having a solid content of 40% by weight.

Evaluation Experiment 2: Hardness of separation from the ceramic insulating plate was evaluated The adhesives obtained in Examples 8 to 18 and Comparative Examples 3 to 5 were used to produce laminated sheets 17 for the static chuck apparatus shown in FIG. 1. Aluminum was deposited to a thickness of 500 angstroms on each of insulating films of polyimide films having a thickness of 50 micrometers ("Kapton" manufactured by Du Pont-Toray Co., Ltd.) to form an electrode layer 20 having the shape as shown in FIG. 3. Then, the surfaces where the electrodes were formed were coated with the adhesives of Examples 8 to 18 and Comparative Examples 3 to 5 so that the thickness after the drying would be 20 micrometers, and they were dried and heated at 150° C. for 5 minutes to be half-hardened. On these adhesive layers were coated these same adhesives so that the thickness after drying would be 20 micrometers, and they were dried to be half-hardened to form half-hardened adhesive layers having a total thickness 40 micrometers.

Each of these laminated sheets was adhered to each of ceramic insulating plates (not formed with an electrode) whose diameter was 8 inches, whose thickness was 3 mm, and whose surface was smooth, and they were subjected to step curing at 100 to 150° C. to harden the second adhesive layers 36.

The thus obtained laminates of the ceramic insulating plates and the laminated sheets were placed in a heat cycle test apparatus. After a cycle wherein they were heated to 150° C. and after they were retained for 30 minutes, they were cooled quickly to −40° C. and were retained for 30 minutes was repeated 60 times, they were brought to normal temperatures. Then, it was visually confirmed whether or not there was any separation of the adhesive layer.

As a result, there was no separation in the laminated sheets wherein the adhesives of Examples 8 to 18 and Comparative Examples 1 and 2 were used whereas partial separation from the ceramic insulating plate occurred in the laminated sheet wherein the adhesive of Comparative Example 3 was used.

Evaluation Experiment 3: Elongation and Warping were Evaluated

One surface of polyethylene terephthalate films (having a thickness of 37 micrometers) that were previously subjected to release treatment was coated with of the adhesives of Examples 8 to 18 and Comparative Examples 3 to 5 respectively, and the adhesive was dried at 120° C. for 5 minutes to form an adhesive layer having a thickness of 20 micrometers, thereby making each adhesive sheet.

Further, two polyethylene terephthalate films on each of which an adhesive layer was formed using the adhesive Example 8 were put together with the adhesive layers faced and then one of the film was separated to form an adhesive sheet having an adhesive layer 40 micrometers in thickness (Example 19). Two insulating sheets obtained in Example 19 were prepared, the adhesive layers were put together with the adhesive layers faced, and one of the film was separated to form an adhesive sheet having an adhesive layer 80 micrometers in thickness (Example 20)

After the above adhesive sheets were heated at 180° C. for 1 hour to harden the adhesives, they were cut into rectangles measuring 10 mm×100 mm, each of them was put on a universal tensile machine ("Tensilon" manufactured by Shimadzu Corporation) and was pulled at 50 mm/minutes in the direction of the length of the film, and the elongation immediately before the breakage of the film was measured. The results are shown in Table 2.

Further, the films were separated from the adhesive sheets wherein the adhesive layers of Examples 8 to 18 and Comparative Examples 3 to 5 were formed and the adhesive sheets of Examples 19 and 20, each of the adhesive layers only was placed between a sheet of borosilicate glass measuring 76 mm×52 mm×0.9 mm and an aluminum sheet measuring 76 mm×52 mm×5 mm, they were adhered by a laminating apparatus, and then were heated 120° C. for 2 hours to harden the adhesive layer. After it was brought to normal temperatures, the depth (micrometer) of the warping occurred in the glass surface was measured by a digital type depth microscope. Further, (the depth of the warping)/(the length of the diagonal of the glass sheet) was calculated as the warping ratio (%). The results are shown in Table 2.

TABLE 2

|  | Elongation (%) | Depth of warping (mm) | Warping ratio (%) |
| --- | --- | --- | --- |
| Example 8 | 230 | 18 | 0.020 |
| Example 9 | 260 | 15 | 0.016 |
| Example 10 | 230 | 18 | 0.020 |
| Example 11 | 230 | 16 | 0.017 |
| Example 12 | 260 | 13 | 0.013 |
| Example 13 | 200 | 18 | 0.020 |
| Example 14 | 200 | 15 | 0.016 |
| Example 15 | 210 | 10 | 0.011 |
| Example 16 | 170 | 17 | 0.018 |
| Example 17 | 180 | 16 | 0.017 |
| Example 18 | 170 | 8 | 0.009 |
| Example 19 | 180 | 10 | 0.011 |
| Example 20 | 180 | 3 | 0.003 |
| Comparative Example 3 | 40 | 40 | 0.043 |
| Comparative Example 4 | 60 | 38 | 0.041 |
| Comparative Example 5 | 15 | 35 | 0.038 |

As is apparent from the results shown in Table 2, the adhesive layers of Examples 8 to 20 according to the present invention are considerably higher in elongation and richer in elasticity than those of Comparative Examples 3 to 5. Further, since the stress produced during the hardening is small, the warping occurring in the glass surface is small. This is a preferable property with a view to preventing a wafer attraction surface from being warped and with a view to preventing a ceramic insulating plate from being damaged.

What is claimed is:

1. A static chuck apparatus comprising a metal substrate, a first adhesive layer provided on said metal substrate, a ceramic insulating plate provided on said first adhesive layer, a second adhesive layer provided on said ceramic insulating plate, an insulating film provided on said second adhesive layer, and an electrode provided between said second adhesive layer and said insulating film.

2. A static chuck apparatus as claimed in claim 1, wherein said metal substrate, said first adhesive layer, said ceramic insulating plate, and said second adhesive layer are formed so as to have a through-hole extending therethrough in the direction of the thickness thereof, and an electricity feeding member connected to said electrode is provided through said through-hole.

3. A static chuck apparatus as claimed in claim 1, wherein the thickness of said electrode is 300 angstroms to 10 micrometers, the thickness of said insulating film is 20 to 75 micrometers, the thickness of said ceramic insulating plate is 0.3 to 8 mm, the thickness of said first adhesive layer is 20 to 200 micrometers, and the thickness of said second adhesive layer is 5 to 50 micrometers.

4. A static chuck apparatus as claimed in claim 1, wherein at least one of said first adhesive layer and said second adhesive layer contains one or more selected from among butadiene/acrylonitrile copolymers, olefin copolymers, polyphenyl ether copolymers and a hindered phenol-type antioxidant.

5. A static chuck apparatus as claimed in claim 4, wherein the weight reduction ratio of said hindered phenol-type antioxidant when heated to 200° C. is less than 5%, and the warping ratio of said first and second adhesive layer is preferably 0.03% or less.

6. A method for producing a static chuck apparatus, comprising the steps of bonding the undersurface of a ceramic insulating plate to a metal substrate through a first adhesive layer, forming an electrode layer on one surface of an insulating film, forming a second adhesive layer on the surface of said insulating film on which said electrode is formed, and joining said second adhesive layer to the upper surface of said ceramic insulating plate.

7. A static chuck apparatus, comprising a metal substrate, a first adhesive layer provided on said metal substrate, a ceramic insulating plate provided on said first adhesive layer, a second adhesive layer provided on said ceramic insulating plate, an insulating film provided on said second adhesive layer, and an electrode embedded in the upper surface of said ceramic insulating plate.

8. A static chuck apparatus as claimed in claim 7, wherein said metal substrate, said first adhesive layer, said ceramic insulating plate are formed with a through-hole extending therethrough in the direction of the thickness thereof, and an electricity feeding member connected to said electrode is provided through said through-hole.

9. A static chuck apparatus as claimed in claim 7, wherein said electrode is made of a palladium alloy and said insulating film is made of a polyimide.

10. A static chuck apparatus as claimed in claim 7, wherein the thickness of said electrode is 0.05 to 2 mm, the thickness of said insulating film is 20 to 75 micrometers, the thickness of said ceramic insulating plate is 0.5 to 8 mm, the thickness of said first adhesive layer is 20 to 200 micrometers, and the thickness of said second adhesive layer is 5 to 100 micrometers.

11. A static chuck apparatus as claimed in claim 7, wherein at least one of said first adhesive layer and said second adhesive layer contains one or more selected from among butadiene/acrylonitrile copolymers, olefin copolymers, polyphenyl ether copolymers, and a hindered phenol-type antioxidant.

12. A static chuck apparatus as claimed in claim 7, wherein the weight reduction ratio of said hindered phenol-type antioxidant when heated to 200° C. is less than 5%, and the warping ratio of said first and second adhesive layer is preferably 0.03% or less.

13. A method for producing a static chuck apparatus, comprising the steps of forming an electrode by embedding said electrode in the upper surface of a ceramic insulating plate, bonding the undersurface of said ceramic insulating plate to a metal substrate through a first adhesive layer, and bonding an insulating film to the upper surface of said ceramic insulating plate through a second adhesive layer.

* * * * *